(12) United States Patent
Nyce

(10) Patent No.: US 6,791,427 B1
(45) Date of Patent: Sep. 14, 2004

(54) LOW DUTY CYCLE OSCILLATOR

(75) Inventor: David S. Nyce, Apex, NC (US)

(73) Assignee: MTS Systems Corporation, Eden Prairie, MN (US)

( * ) Notice: Subject to any disclaimer, the term of this patent is extended or adjusted under 35 U.S.C. 154(b) by 0 days.

(21) Appl. No.: 10/424,245

(22) Filed: Apr. 28, 2003

(51) Int. Cl.[7] ............................... H03B 5/20; H03B 5/24
(52) U.S. Cl. ..................................... 331/143; 331/111
(58) Field of Search ............................. 331/111, 143, 331/179, DIG. 3

(56) References Cited

U.S. PATENT DOCUMENTS 4,723,114 A * 2/1988 D'Arrigo et al. ........... 331/111

* cited by examiner

Primary Examiner—David Mis
(74) Attorney, Agent, or Firm—David M. Ostfeld

(57) ABSTRACT

A circuit is shown which outputs a pulse width having a duty cycle of less than 50% and the circuit having an oscillator providing a desired repetition rate controlled by a changing RC time constant.

8 Claims, 1 Drawing Sheet

IC1 = 74C14
IC2 = xx555
IC3 = CD4066
Q1 = N channel MOSFET

LOW DUTY CYCLE OSCILLATOR

BACKGROUND OF THE INVENTION

1. Field of the Invention

The present invention relates to oscillators and in particular magnet-based oscillators that are low duty cycle.

2. Description of the Art

Magnetostrictive transducers having elongated waveguides that carry torsional strain waves induced in the waveguide when current pulses are applied along the waveguide through a magnetic field are well known in the art. A typical linear distance measuring device using a movable magnet that interacts with the waveguide when current pulses are provided along the waveguide is shown in U.S. Pat. No. 3,898,555.

Devices of the prior art of the sort shown in U.S. Pat. No. 3,898,555 also have the sensor element in a housing which also houses the electronics to at least generate the pulse and receive the return signal. The amplitude of the return signal detected from the acoustical strain pulse is, as well known in the art, affected by many parameters. These parameters include the position magnet strength, waveguide quality, temperature, waveguide interrogation current, and assembly tolerances.

A low duly cycle oscillator is used to provide a relatively short pulse width at a relatively long period repitition rate. An example would be the waveguide driving circuit for a magnetostrictive position sensor. This type of driving circuit of the prior art supplies a one or two microsecond pulse at a repetition rate with a period of one millisecond to one second. A one microsecond pulse with a repetition rate having a period of one millisecond would be a duty cycle of only 0.1% this function is usually accomplished by driving a one microsecond monostable multivibrator from the output of a one kilohertz oscillator. A similar function is usually required in ultrasonic sensors or other time-of-flight measurement circuits.

Several types of magnetic-based sensors are available for measuring linear or rotary position. Magnetic-based sensors have an advantage in that they provide non-contact sensing; so there are no parts to wear out. Examples of magnetic-based sensors are LVDTs, inductive sleeve sensors, and magnetostrictive sensors.

A first previous version of low duty cycle oscillators used in, for example, magnetostrictive devices, have used a combination of a 50% duty cycle low frequency oscillator and a monostable multivibrator (one-shot) as shown in FIG. 1. The oscillator sets the repetition rate and the one-shot outputs the short duration pulse.

A second previous version of a low duty cycle oscillator has been based on a standard oscillator using one or more digital gates, where the charge up and charge down times are steered through different paths by using one or more diodes, as shown in FIGS. 2 and 3. This circuit can satisfy some requirements, but has a substantial temperature coefficient because of the approximately 2.2 mV per degree celcius temperature coefficient of the diode forward voltage drop. The forward voltage drop of approximately 0.6V is also an error that must be accounted for in the timing and performance characteristic calculations.

A third previous version of a low duty cycle oscillator has used software control of a microcontroller output port to produce the desired dutycycle. This is inexpensive, but requires a high degree of dedication of the microcontroller capability to performing this simple function.

It is an object of the present invention to employ a simple circuit to accomplish producing a relatively short pulse at a relatively long period repetition rate.

SUMMARY OF THE INVENTION

The present invention relates to a simple circuit to realize the function of a low duty cycle oscillator (less than 50% and preferably 10% or less) to provide a relatively short pulse width at a relatively long period repetition rate by using common integrated circuit components. The I.C. components comprise several copies of the same function in one package. Portions of these multi-part components, sufficient to implement the instant circuit, are often left unused in a typical circuit design application. Therefore, this circuit can be implemented with little additional expense and overcomes the inefficiency and inaccuracies of the prior art.

DESCRIPTION OF THE DRAWINGS

For a further understanding of the nature and objects of the present invention, reference should be had to the following figures in which like parts are given like reference numerals and wherein.

DESCRIPTION OF THE PREFERRED EMBODIMENT

The invention uses an oscillating circuit, the frequency of which is determined by a resistor and a capacitor. Low duty cycle (less than 50% and preferably 10% or less) is achieved by sensing when the on-time occurs and shunting the resistor with a second resistor during that time, thus reducing that portion of the cycle.

Figure 4:
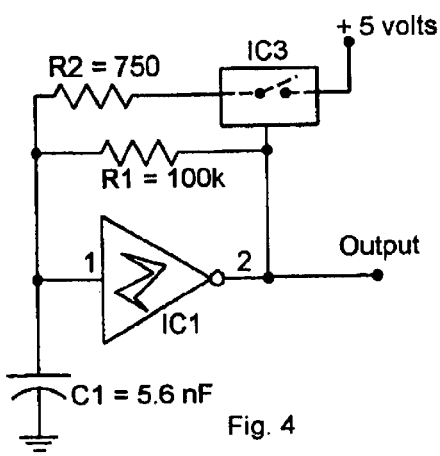
FIG. 4 is a schematic of a circuit utilizing a Low Duty Cycle Oscillator of the present invention.

In the circuit of FIG. 4 for a pulse width having a duty cycle of less than 10%, IC1 is a CMOS Schmitt trigger, such as a 74C14, normally one of six included in a package. IC3 is a CMOS bilateral switch, such as an CD4066, normally one of four included in a package.

Referring to FIG. 4, IC1 has an input Pin 1 and an output Pin 2. Input Pin 1 is connected to a capacitor C1 which is connected to ground. Typically, capacitor C1 may be 5.6 nanofarads. Pin 1 is also connected to a resistor R1 which is connected at its other end to Pin 2 of IC1. Typically, R1 may be a 100,000 ohm resistor. Lead 1 is also connected to a second resistor R2 whose other end is connected to a switched pin of IC3. R1 is also connected to the control pin of IC3 in its connection with Pin 2 of IC1. Typically, R2 is 750 ohms. The other switched pin of IC3 is connected to the five volt reference source.

Figure 1:
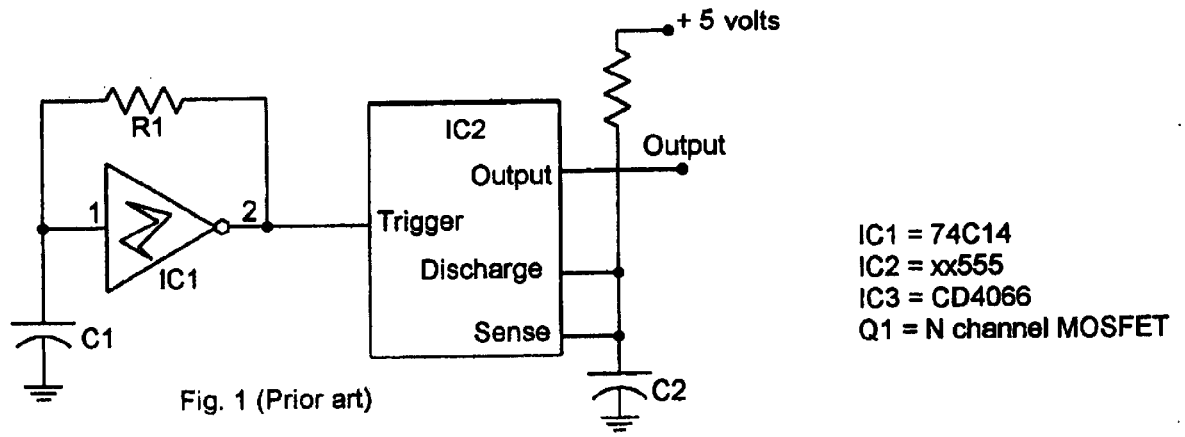
FIG. 1 is a schematic of a circuit of a prior art for Low Duty Cycle Oscillators.
Figure 2:
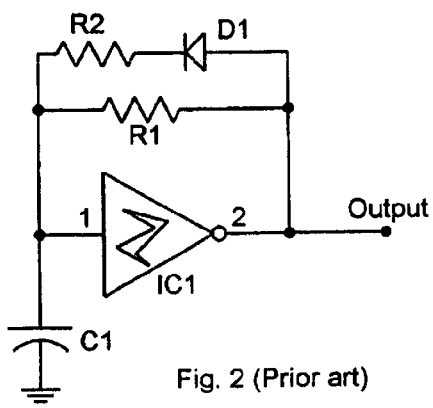
FIG. 2 is a schematic of a circuit of the prior art showing a second Low Duty Cycle Oscillator.
Figure 3:
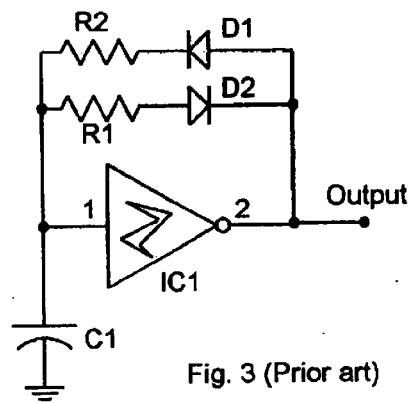
FIG. 3 is a third schematic of a circuit of the prior art showing a Low Duty Cycle Oscillator.

When IC1 pin 2 is low, R1 discharges C1, taking a time period of approximately R1×C1 seconds. When IC1 pin 2 goes high, IC3 switches to close the connection between +5V and R2. This places R2 in an essentially parallel path to R1 for charging up C1. The faster charge rate results in an on-time for IC1 pin 2 (the time during which the output is high), of the parallel combination of R1 and R2×C1 seconds. An additional advantage of this configuration is that the smaller value resistor, R2, is driven by a source other than IC1 pin 2. This means that IC1 pin 2 will not be affected by trying to drive a higher current during the positive half cycle, as would be the case in the circuit of the prior art FIG. 1 or 2.

Figure 5:
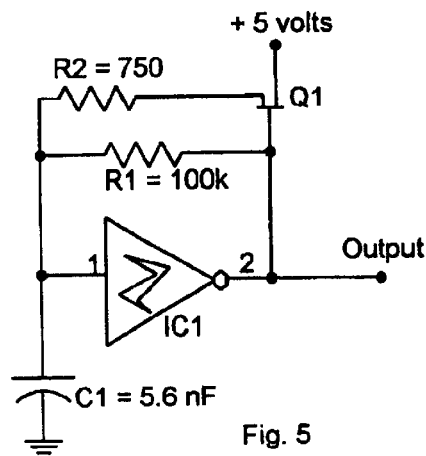
FIG. 5 is a schematic of a circuit utilizing a Low Duty Cycle Oscillator of the present invention but using an n channel enhancement mode MOSFET instead of the IC3 of FIG. 4.

As shown in FIG. 5, substantially the same circuit is used as in FIG. 4 except that a n-channel enhancement mode MOSFET Q1 and there is a second circuit which may be identical to IC1 or could be any inverter. It is connected to Q1.

Alternatively, any kind of oscillator could be used such as two inverters or any other type of oscillator. There are a myriad number of ways that an oscillator can be made by those skilled in the art. Further, the oscillators can be set for a minority portion of the duty cycle.

Because many varying and different embodiments may be made within the scope of the invention concept taught herein which may involve many modifications in the embodiments herein detailed in accordance with the descriptive requirements of the law, it is to be understood that the details herein are to be interpreted as illustrative and not in a limiting sense.

What is claimed as invention is:

1. A circuit to produce a pulse width having a duty cycle of less than 50%, comprising:

an oscillator, a resistor and a capacitor, said oscillator having an output with a first repetition rate, said repetition rate set by values of said resistor and said capacitor thereby driving said oscillator at said first repetition rate;

a switch connected to said output of said oscillator, said switch causing the time period of said oscillator to be shortened for a portion of the period set by said resistor and said capacitor;

said switch acting together with at least one second resistor to change the time constant for the shorter time part of the cycle.

2. A circuit as in claim 1, wherein said oscillator includes at least one digital gate.

3. A circuit as in claim 2, wherein said gate is a Schmitt trigger.

4. A circuit as in claim 2, wherein there is included at least one inverter.

5. A circuit as in claim 1, wherein said switch is a field effect transistor.

6. A circuit to produce a pulse width having a duty cycle of less than 50%, comprising:

an oscillator and circuit components, said oscillator having an output at a first repetition rate, said first repetition rate set by values of said circuit components for a time constant, said components driving said oscillator at said first repetition rate;

a switch connected to said output of said oscillator, said switch causing the time period of said oscillator to be shortened for a portion of the period set by said components, said switch acting together with at least one additional component resistor to change said time constant for the longer time part of the cycle.

7. The circuit of claim 6, wherein said circuit components are at least one resistor and one capacitor.

8. The circuit of claim 7, wherein said additional component is at least one resistor.

* * * * *